(12) United States Patent
Reinmuth et al.

(10) Patent No.: US 9,034,757 B2
(45) Date of Patent: May 19, 2015

(54) METHOD FOR MANUFACTURING A COMPONENT HAVING AN ELECTRICAL THROUGH-CONNECTION

(71) Applicants: Jochen Reinmuth, Reutlingen (DE); Jens Frey, Filderstadt (DE); Yvonne Bergmann, Reutlingen (DE)

(72) Inventors: Jochen Reinmuth, Reutlingen (DE); Jens Frey, Filderstadt (DE); Yvonne Bergmann, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 13/923,035

(22) Filed: Jun. 20, 2013

(65) Prior Publication Data

US 2014/0027927 A1 Jan. 30, 2014

(30) Foreign Application Priority Data

Jun. 21, 2012 (DE) .......................... 10 2012 210 480

(51) Int. Cl.
| | |
|---|---|
| *H01L 21/44* | (2006.01) |
| *H01L 21/762* | (2006.01) |
| *H01L 23/48* | (2006.01) |
| *B81B 7/00* | (2006.01) |
| *B81C 1/00* | (2006.01) |
| *H01L 23/00* | (2006.01) |

(52) U.S. Cl.
CPC ........ *H01L 21/76224* (2013.01); *H01L 23/481* (2013.01); *H01L 24/02* (2013.01); *H01L 24/29* (2013.01); *H01L 24/32* (2013.01); *H01L 24/83* (2013.01); *H01L 24/92* (2013.01); *H01L 24/94* (2013.01); *H01L 2224/05009* (2013.01); *H01L 2224/29111* (2013.01); *H01L 2224/29124* (2013.01); *H01L 2224/29147* (2013.01); *H01L 2224/32145* (2013.01); *H01L 2224/32225* (2013.01); *H01L 2224/83193* (2013.01); *H01L 2224/83805* (2013.01); *H01L 2224/92* (2013.01); *H01L 2224/9202* (2013.01); *H01L 2224/94* (2013.01); *H01L 2224/02311* (2013.01); *H01L 2224/29117* (2013.01); *B81B 7/007* (2013.01); *B81C 1/00095* (2013.01); *B81B 2207/096* (2013.01); *H01L 2924/1461* (2013.01)

(58) Field of Classification Search
None
See application file for complete search history.

(56) References Cited

U.S. PATENT DOCUMENTS

| | | | |
|---|---|---|---|
| 7,646,100 B2 * | 1/2010 | Kameyama et al. .......... | 257/774 |
| 2010/0164062 A1 * | 7/2010 | Wang et al. .................. | 257/532 |
| 2011/0001245 A1 * | 1/2011 | Jobetto ........................ | 257/773 |
| 2011/0031565 A1 * | 2/2011 | Marx et al. ................... | 257/417 |
| 2011/0057321 A1 * | 3/2011 | Wang et al. .................. | 257/774 |
| 2011/0062587 A1 * | 3/2011 | Yang et al. ................... | 257/751 |
| 2012/0003832 A1 * | 1/2012 | Bartsch et al. ............... | 438/666 |
| 2012/0038030 A1 * | 2/2012 | Frey et al. .................... | 257/621 |
| 2012/0094437 A1 * | 4/2012 | Han et al. ..................... | 438/109 |

* cited by examiner

*Primary Examiner* — Wensing Kuo
*Assistant Examiner* — Herve Assouman
(74) *Attorney, Agent, or Firm* — Kenyon & Kenyon LLP (57) ABSTRACT

A method for manufacturing a component having an electrical through-connection is described. The method includes the following steps: providing a semiconductor substrate having a front side and a back side opposite from the front side, producing an insulating trench, which annularly surrounds a contact area, on the front side of the semiconductor substrate, filling the insulating trench with an insulating material, producing an electrical contact structure on the front side of the semiconductor substrate by depositing an electrically conductive material in the contact area, removing the semiconductor material remaining in the contact area on the back side of the semiconductor substrate in order to produce a contact hole which opens up the bottom side of the contact structure, and depositing a metallic material in the contact hole in order to electrically connect the electrical contact structure to the back side of the semiconductor substrate.

14 Claims, 13 Drawing Sheets

METHOD FOR MANUFACTURING A COMPONENT HAVING AN ELECTRICAL THROUGH-CONNECTION

FIELD OF THE INVENTION

The present invention relates to a method for manufacturing a component, in particular a microelectromechanical component, having an electrical through-connection.

BACKGROUND INFORMATION

Electrical contact structures which extend through a semiconductor substrate are used, among other things, in microelectromechanical system components (MEMS, microelectromechanical system). Thus, such contact structures, also referred to as a through contact, through-connection, via (vertical interconnect access), or, in the case of a silicon substrate, as a through silicon via (TSV), are used, for example, to electrically connect various planes of the component to one another. These vertical through-connections allow a particularly space-saving design. In addition to simple rewirings, such through-connections allow individual components to be stacked on top of one another to form a so-called 3D package. Thus, for example, a sensor chip, a sensor cap, and an evaluation circuit (ASIC) may be put together in a space-saving manner in the form of a 3D package, the vertical electrical connections between the individual components being implemented with the aid of electrical through-connections. The term "MEMS 3D integration" is also used for the stacking and through contacting of individual components.

In implementing vertical contacts, the aim is to achieve contact structures having the smallest possible base area. At the same time, electrical through-connections should have the lowest possible volume resistance. To achieve this, very narrow holes having practically vertical walls are generally provided in the semiconductor substrate. This may be achieved using a customary trench method or a laser, for example. After the subsequent deposition of a thin insulating layer on the side walls and the base of the contact holes and opening of the insulating layer at the base of the contact hole, the holes are completely or partially filled with a metal. The filling is carried out either with the aid of a chemical vapor deposition (CVD) process or by depositing a metal layer with the aid of an electroplating process in combination with a previously deposited starting layer (seed layer).

Since in this concept the production of the through-connections takes place at the very end of the wafer process, these approaches are also referred to as "via-last." A critical factor, among others, in these via-last approaches is the poor quality of the insulating layer, since the deposition of insulating material in the deep holes having a high aspect ratio may be achieved only in small thicknesses due to technical reasons. In addition, the oxides typically used as the insulating material have relatively poor oxide quality, since only deposition processes having a low maximum process temperature may be used at the end of the wafer processing. Due to the high aspect ratio of the holes, opening the insulating layer at the base of the holes is also particularly difficult. This is true in particular for thick insulating layers. Lastly, the deposition of a diffusion barrier, which is typically carried out prior to the metal deposition, is also very difficult technically due to the high aspect ratio and the depth of the holes.

In principle, through-connections may also be produced in earlier process stages. Thus, for example, in the middle of the wafer process a blind hole may be produced in the wafer and provided with an insulating layer and a barrier layer. After subsequent filling of the contact hole with a metal, a connection between the metallic filling and structures on the front side of the wafer may be established in a simple front-side process. Further front-side processes may subsequently take place. The filled blind hole is typically produced prior to the production of the metal printed conductors on the front side of the wafer, in the so-called metal back-end process.

At the end of the standard wafer process sequence, the wafer is ground on the back side, the grinding being made deep enough that the metallic filling of the blind hole is exposed. Lastly, an insulating layer is deposited on the back side of the wafer, and contact areas for the metal contact surfaces are opened in the insulating layer. Rewiring of the metal contacts may then also be carried out via a further metal layer which is deposited on the back side of the wafer. In these typical via-middle processes, differences in the thermal coefficients of expansion of the metals used and of the silicon substrate may result in damage to the previously applied TSV structures during the back-end processes. In addition, the grinding process has proven to be very difficult, since various materials such as silicon, oxide, barrier material, and metal must be ground at the same time; furthermore, metal smearing over the oxide insulating surface must be avoided to the greatest extent possible.

SUMMARY

An object of the present invention, therefore, is to provide a via-middle approach for producing an electrical through-connection, which is robust at elevated back-end process temperatures, and which at the same time avoids metal entrainment during the grinding.

According to the present invention, a method for manufacturing a component having a through-connection is provided in which a semiconductor substrate having a front side and a back side opposite from the front side is provided, and an insulating trench which annularly surrounds a contact area is produced on the front side of the semiconductor substrate. An insulating material is subsequently introduced into the insulating trench to produce a ring-shaped insulating structure. Method steps of a back-end process are then carried out, within the scope of which an electrical contact structure is produced on the front side of the semiconductor substrate by depositing an electrically conductive material in the contact area. The semiconductor material remaining in the contact area is subsequently removed on the back side of the semiconductor substrate in order to produce a contact hole which opens up the bottom side of the contact structure. Lastly, a metallic material is deposited in the contact hole in order to electrically connect the electrical contact structure to the back side of the semiconductor material. In this method, the contact hole is not filled with metal until the end of the manufacturing process for the component, so that the finished through-connection is not exposed to elevated back-end process temperatures. The damage to the TSV structures which usually occurs during the back-end processes due to the different thermal coefficients of expansion of the metal filling of the through-connection and of the semiconductor substrate may thus be avoided. At the same time, higher maximum process temperatures may be used at the end of the wafer processing, which, for example, allows better quality of the deposited oxide layers. Due to the use of the ring-shaped insulating trench, a particularly thick insulating layer may be achieved between the metal filling of the through-connection and the surrounding semiconductor material, which in turn reduces the risk of leakage currents and capacitive interferences. Compared to a via-last process, in which the through-connection is applied at the very end of the wafer process, in the method according to the present invention neither deposition of a diffusion barrier nor opening of the insulating layer at the base of the contact hole through the contact hole is necessary. The accompanying problems are thus eliminated.

According to one specific embodiment, the insulating trench is designed as a blind hole, and after the electrical contact structure is produced on the front side of the semiconductor substrate, the semiconductor substrate is thinned from the back side in order to expose the insulating material. This method allows greater layer thicknesses of the wafer during processing, thus on the one hand simplifying the handling of the wafer and on the other hand reducing the risk of breakage of the wafer. Since the contact hole is not filled with metal until after the semiconductor wafer has been ground, in contrast to a via-middle approach the risk of metal smearing over the oxide insulating surface is reduced.

In another specific embodiment it is provided that an insulating layer is produced on the back side of the semiconductor substrate after the semiconductor substrate is thinned. The semiconductor material remaining in the contact area is subsequently selectively removed with respect to the insulating layer and with respect to the insulating material in the insulating trench with the aid of an isotropic etching process. A self-adjusting opening of the contact hole is thus achieved. Deep contact holes having high aspect ratios may also be reliably etched.

Another specific embodiment provides that the insulating layer is produced on the back side of the semiconductor substrate, and the semiconductor material is removed from the front side of the substrate to produce the insulating trench down to the insulating layer. The insulating layer is then opened in the contact area on the back side of the semiconductor substrate, and the contact hole is produced by selectively etching the semiconductor material remaining in the contact area with respect to the insulating layer and with respect to the insulating material in the insulating trench. With the aid of this method, contact holes having defined depths may be produced in a particularly simple way. The insulating layer produced on the back side is thus used for producing the insulating trench in a front-side process, and also for opening the contact hole in a back-side process.

In another specific embodiment it is provided that a combination of an oxide deposition and a polysilicon deposition is used for introducing the insulating material into the insulating trench. This combined material deposition is particularly advantageous for filling trenches having an average trench width.

In another specific embodiment it is provided that glass, in particular borosilicate glass, which is introduced into the insulating trench with the aid of an embossing process, is used as the insulating material. By using glass, and in particular borosilicate glass, as the insulating material, relatively wide insulating trenches may be produced, thus reducing the risk of possible parasitic capacitances and leakage currents. In particular, fairly wide trenches may be filled in a particularly advantageous manner with the aid of the embossing process. Since glass has a coefficient of thermal expansion comparable to that of silicon, thermally induced mechanical stresses in the substrate may thus be reduced.

In another specific embodiment it is provided that the deposition of the metallic material in the contact hole is carried out together with establishing rewiring on the back side of the semiconductor substrate. Method steps may thus be saved, also resulting in simplification of the manufacturing process, and thus also in a reduction in the manufacturing costs for the component.

Another specific embodiment provides that the thinning of the semiconductor substrate is carried out with the aid of a grinding process, a wet or dry etching process, or a combination of a grinding process and a wet or dry etching process. Particularly thick semiconductor layers may be effectively thinned with the aid of the grinding process. In contrast, wet and dry etching processes allow the selective removal of the semiconductor material.

In another specific embodiment it is provided that a low-temperature deposition process in combination with a barrier layer and/or a seed layer is used for filling the contact hole with the metallic material. The thermal stress on the finished component may be kept relatively low with the aid of the low-temperature deposition process. A barrier layer effectively prevents the diffusion of the metal into the semiconductor material. In contrast, the starting layer or seed layer allows optimal growth of the metallic material in the contact hole.

Another specific embodiment provides that prior to the deposition of the metallic material in the contact hole, the electrical contact structure is electrically connected to a complementary contact structure of the functional substrate within the scope of a bonding process in which the semiconductor substrate is connected to a functional substrate. Since the metal deposition in the contact hole does not take place until after the bonding process, it is ensured that the finished through-connection is not exposed to the thermal stresses which occur during the bonding process.

In another specific embodiment it is provided that a cavern for accommodating a functional structure situated on the surface of the functional substrate is produced before the semiconductor substrate is connected to the functional substrate on the front side of the semiconductor substrate. With the aid of such a cavern, a receiving space for the functional structures is produced which allows a gas-tight enclosure of the functional structures with respect to the outside.

According to the present invention, in addition a component including a semiconductor substrate which has a through-connection that passes through the semiconductor substrate from a front side to a back side opposite from the front side is provided. The through-connection includes an insulating structure composed of an insulating trench which is filled with an insulating material and which annularly surrounds a contact area, an electrical contact structure situated on the front side of the semiconductor substrate in the contact area, and a metallic filling, situated in the contact area, which is delimited by the insulating structure and which electrically connects the electrical contact structure to the back side of the semiconductor substrate. Due to the option of producing the insulating trench with an arbitrary thickness, the through-connection may be adapted to various technical applications. In particular, good electrical insulation of the metallic filling from the surrounding semiconductor substrate may be provided with the aid of a relatively wide insulating trench. At the same time, interfering capacitances are also reduced. Furthermore, the diameter of the metallic filling may have an arbitrary size, so that the volume resistance of the through-connection may be adapted to various applications relatively easily.

In one specific embodiment it is provided that the semiconductor substrate has a cavern and is connected to the functional substrate in such a way that a functional structure situated on the surface of the functional substrate is present inside the cavern. The electrical contact structure is electrically connected to a complementary contact structure of the functional structure. In this configuration, the semiconductor substrate is used as a cap for the functional structures of the functional substrate. The through-connection allows an electrical connection of the functional structure enclosed between the two substrates.

DETAILED DESCRIPTION

Figure 1:
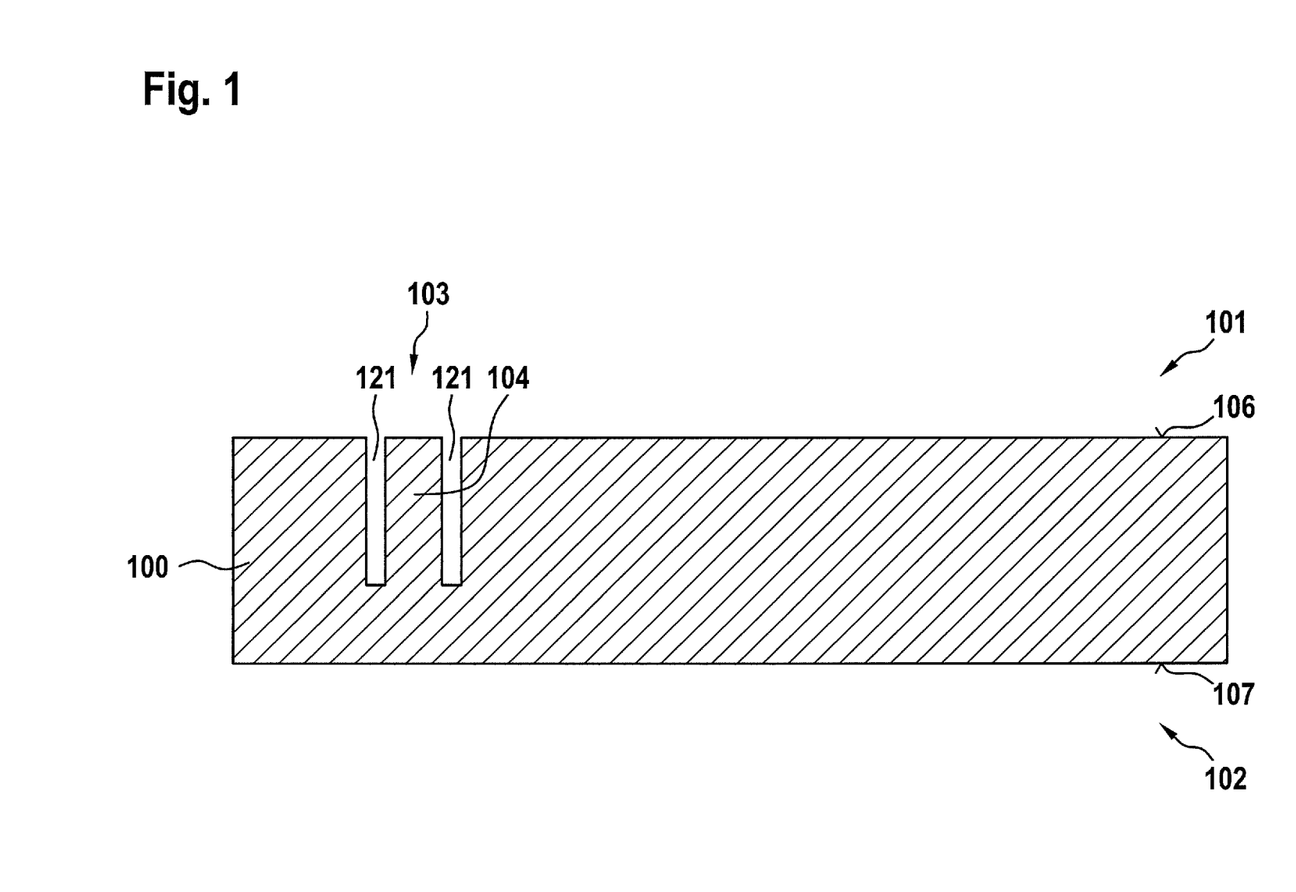
FIG. 1 shows a semiconductor substrate with a ring-shaped insulating trench provided on the front side.

The method according to the present invention is explained in greater detail below as an example, with reference to the manufacture of a component having at least one microelectromechanical functional structure, such as a microelectromechanical motion sensor or yaw rate sensor. The through-connection is produced in a semiconductor substrate which is used as a cap wafer for the microelectromechanical functional structure situated on the functional substrate. The starting point is a semiconductor substrate, for example in the form of a silicon wafer, in which a ring-shaped insulating structure in the form of an insulating trench filled with an insulating material is initially produced. Insulating trench 121 may be produced, for example, using a customary trench method or with the aid of a laser. FIG. 1 shows semiconductor substrate 100, having a front side 101 and a back side 102 opposite from front side 101. A ring-shaped trench structure 121 is initially produced on front side 101 of semiconductor substrate 100. Trench structure 121 surrounds an inner contact area 103 in a ring-shaped manner; in the present case, "ring-shaped" means circular and rectangular as well as other arbitrary closed shapes. Trench structure 121 is produced by removing the semiconductor material with the aid of a photolithographic process (trenching) or with the aid of a laser. The semiconductor material is preferably removed only down to a defined depth, so that trench structure 121 only extends through a portion of semiconductor substrate 100. FIG. 1 shows semiconductor substrate 100 having completely produced trench structure 121.

Figure 2:
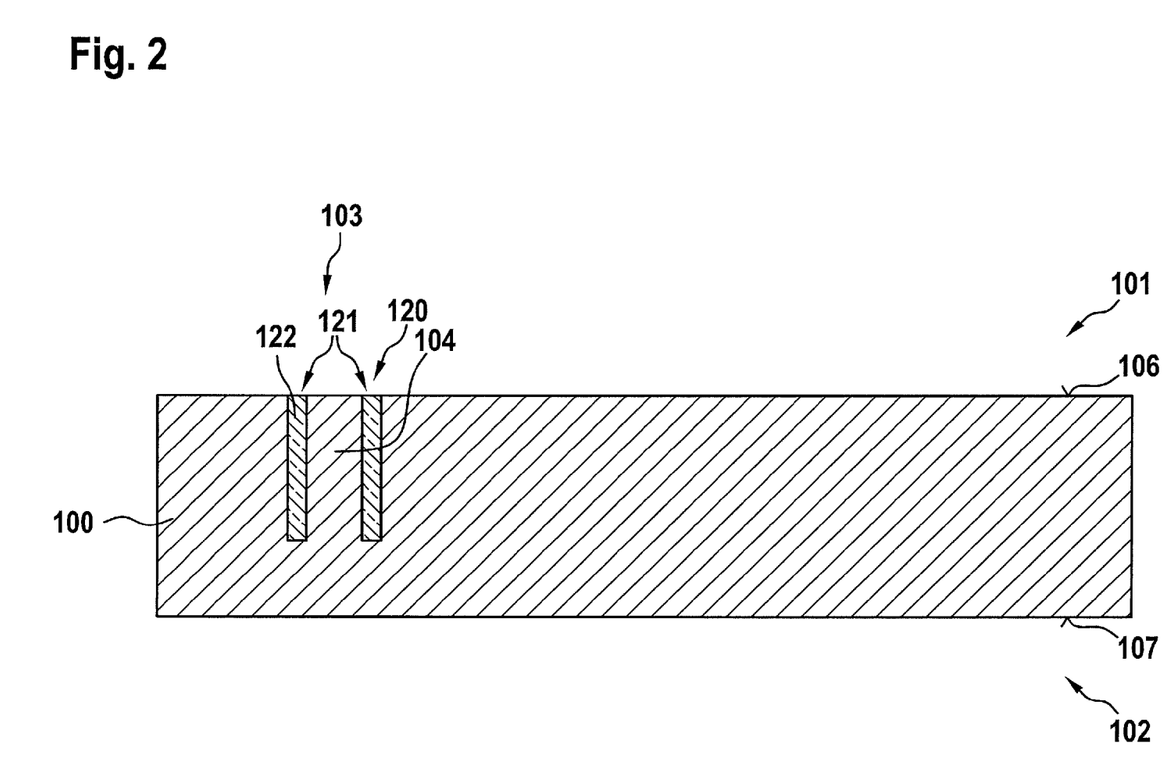
FIG. 2 shows the semiconductor substrate from FIG. 1, with the insulating trench filled with an insulating material.

Trench structure 121 is subsequently filled with an insulating material. High temperatures are allowed in this method stage. Various processes may be used to produce the insulating layer, depending on the application. It is advantageous to use a thermal oxide for closing the trench structures, in particular for trench structures having a relatively small trench width of less than 10 µm. For average trench widths (between 5 µm and 25 µm), the trenches may be filled, for example, with a combination of an oxide deposition and a polysilicon deposition. An oxide layer is initially deposited on the side walls and the base of trench structure 121, and the resulting reduced trench structure is filled using polysilicon. For relatively wide trenches (greater than 10 µm) it may be particularly advantageous to fill the trenches with glass, for example borosilicate glass. For this purpose, the glass is introduced into trench structure 121 in an embossing process. FIG. 2 shows semiconductor substrate 100 with insulating structure 120 produced by depositing an insulating material 122 inside trench structure 121.

After insulating trench 121 is filled, the back-end process is now carried out, an electrical contact surface being produced on the substrate surface which is surrounded by the insulating trench. The back-end process may also include the production of a wafer stack, in which multiple wafers are situated one above the other. Thus, for example, a sensor wafer may be bonded to the prepared substrate wafer. In the present exemplary embodiment, a functional substrate 200 is bonded to semiconductor substrate 100, semiconductor substrate 100 being used as a cap wafer for microelectromechanical functional structures 221 situated on functional substrate 200. An electrical connection to contact elements of functional substrate 200 is to be established with the aid of the through-connection. For this purpose, an electrical contact with the silicon punch which is surrounded by the insulating trench is established, preferably in a CMOS process. For MEMS applications, however, the substrate may also be used as a cap, and a contact area for a second wafer, for example a sensor wafer, may be produced. Establishing electrical contact structure 130 in contact area 103 and connecting the two wafers are preferably carried out in one step, using a metallic bonding process. Bonding processes having two metal layers, which as a combination form alloys having a liquid phase whose melting temperature is below the melting temperature of the individual metal layers, are particularly advantageous. For this purpose, for example aluminum and germanium, copper and tin, and similar systems are suitable as metal combinations.

Figure 3:
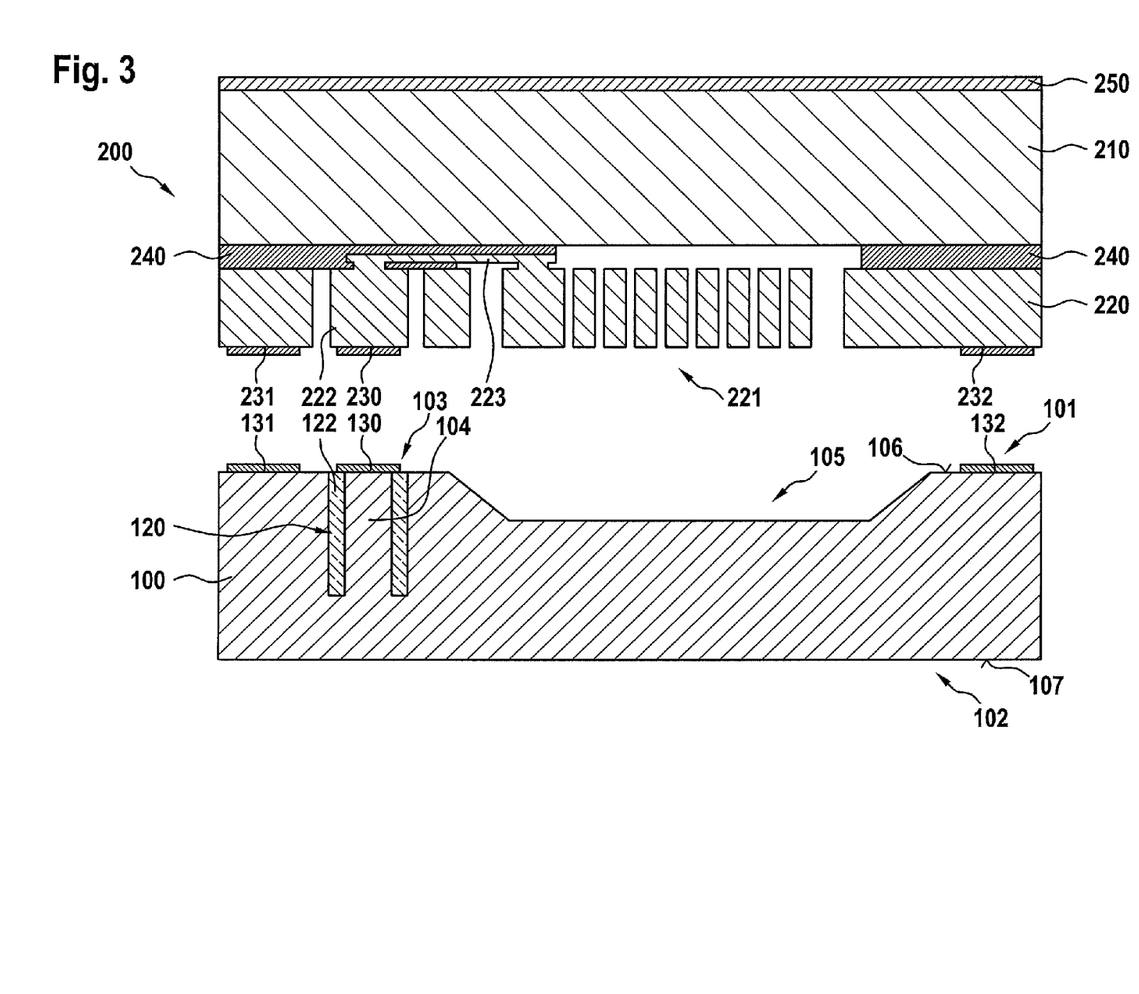
FIG. 3 shows the semiconductor substrate from FIG. 2 with contact structures produced on the front side and a cavern prior to bonding to a functional substrate which includes a functional structure.

FIG. 3 shows semiconductor substrate 100 with electrical contact structure 130 produced in contact area 103, as well as further metal layers 131, 132 on the surface of front side 101 of the substrate which are used as connecting structures. In addition, FIG. 3 shows a chip 200 which has been prepared for bonding to semiconductor substrate 100. Chip 200, which is designed as a sensor chip, for example, includes a functional structure 210 having a functional layer 220 provided thereon. A microelectromechanical functional structure 221, for example a microelectromechanical motion sensor, is provided within functional layer 220, which is separated from functional structure 210 by an insulating layer 240. Microelectromechanical functional structure 221 is connected via electrical terminal and contact structures 222, 223 to an electrical contact structure 230 which is provided for connecting to electrical contact structure 130 of the semiconductor wafer. In addition, multiple connecting structures 231, 232 are situated on functional layer 220 which are used as complementary connecting structures for connection to connecting structures 131, 132 of the semiconductor wafer.

Figure 4:
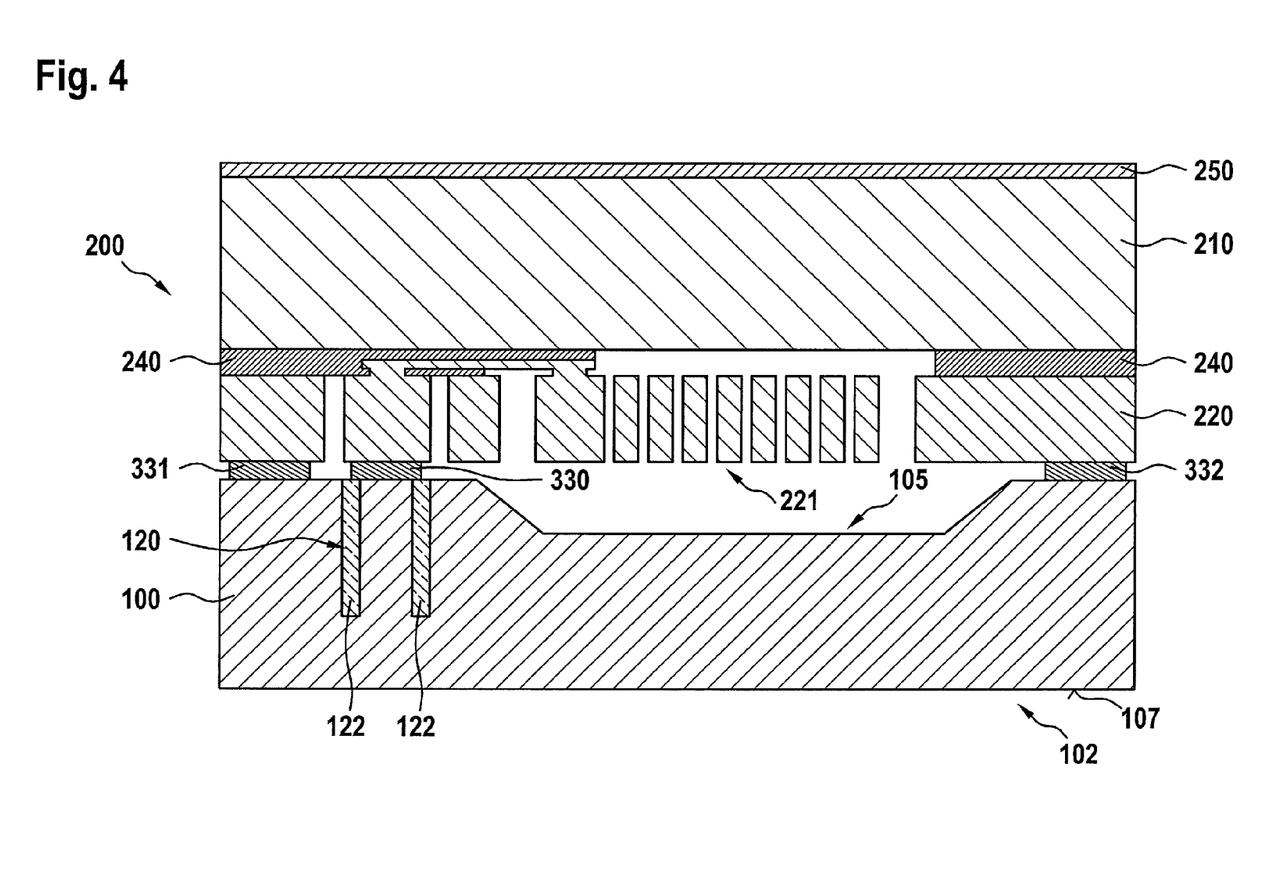
FIG. 4 shows the semiconductor substrate and the functional substrate after the bonding process.

As shown in FIG. 3, a cavern 105 for accommodating microelectromechanical functional structures 221 has been produced in semiconductor substrate 100. The semiconductor material may be removed with the aid of a suitable etching process. For bonding, chip 200 and semiconductor substrate 100 are aligned in such a way that complementary connecting pads 231, 232 abut on connecting pads 131, 132, respectively, and complementary contact pad 230 abuts on contact pad 130. After a heating step, connecting structures 131, 132, 231, 232 now form semiconductor substrate 100 and connecting structures 331, 332 which connect chip 200. In contrast, contact pads 130, 230 (from FIG. 3) now form a contact structure 330 which connects semiconductor substrate 100 to the chip. The corresponding method stage is shown in FIG. 4.

Figure 5:
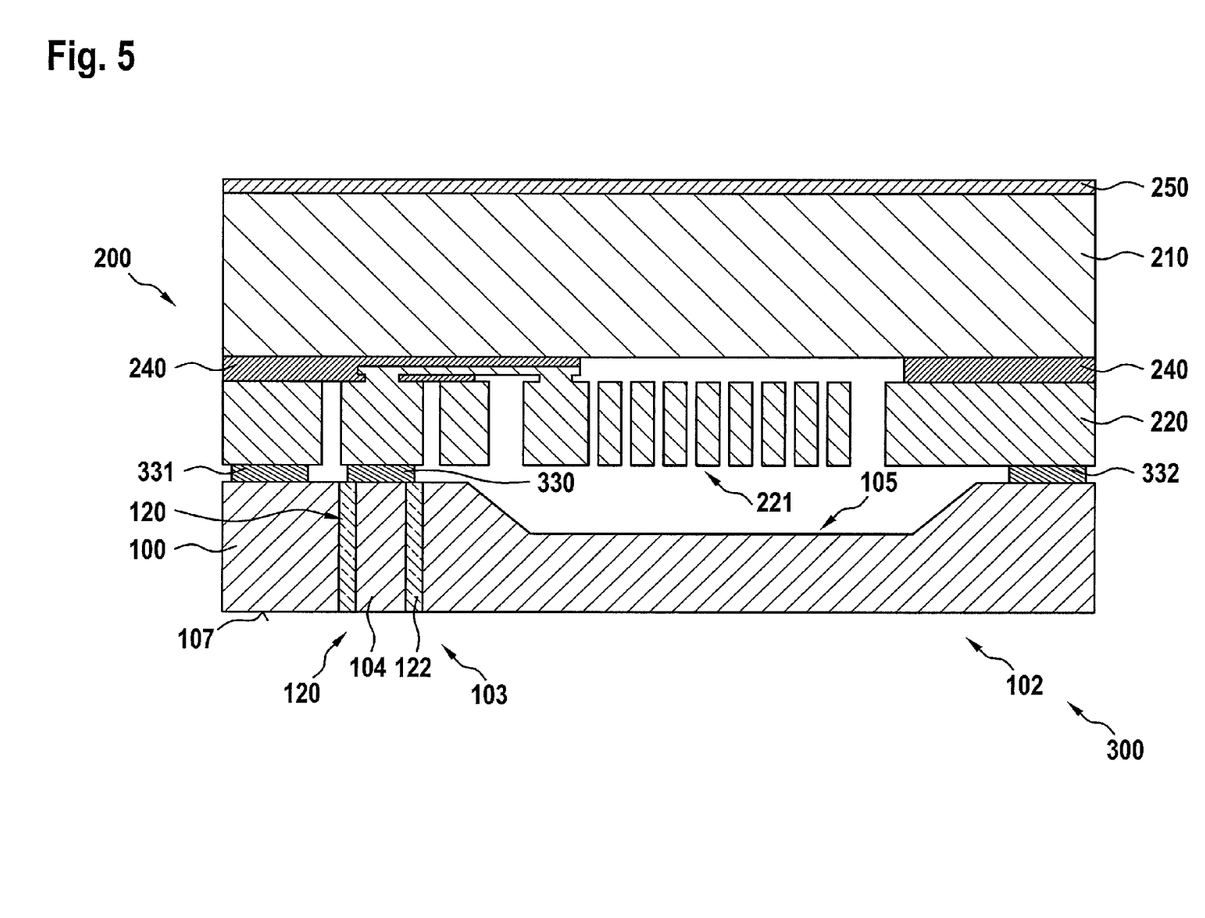
FIG. 5 shows the semiconductor substrate after the semiconductor substrate has been thinned from the back side.

After the back-end process, semiconductor substrate 100 is thinned from back side 102. The thinning may be carried out with the aid of a grinding process, a wet or dry etching process, or a combination of these processes. During the thinning, the semiconductor material on back side 102 of semiconductor substrate 100 is removed with the aid of a grinding process, a wet or dry etching process, or a combination of these processes until insulating trench 121, which is filled with insulating material 122, is completely exposed. FIG. 5 shows a corresponding method stage.

Figure 6:
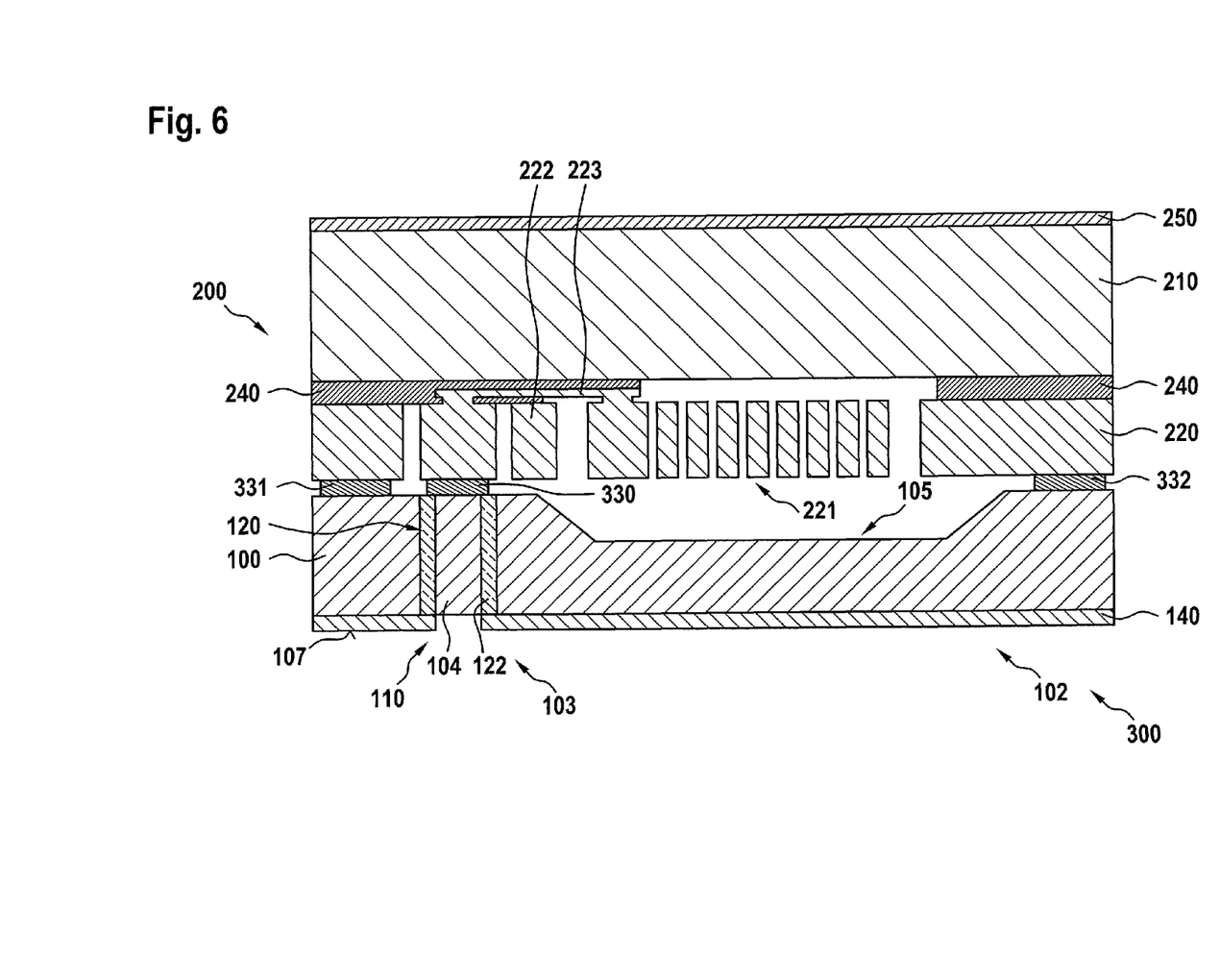
FIG. 6 shows the semiconductor substrate with an insulating layer on the back side of the semiconductor substrate which has been opened in the contact area.

Semiconductor material 104 remaining in contact area 103 between insulating structures 120 is subsequently removed from back side 102 of semiconductor wafer 100 with the aid of a suitable method. An insulating layer 140, which may also be used as a protective mask for etching semiconductor material 104 in contact area 103, has been applied beforehand to back side 102 of the semiconductor substrate. In this case, insulating layer 140 is opened in contact area 103. FIG. 6 shows the corresponding method stage.

Figure 7:
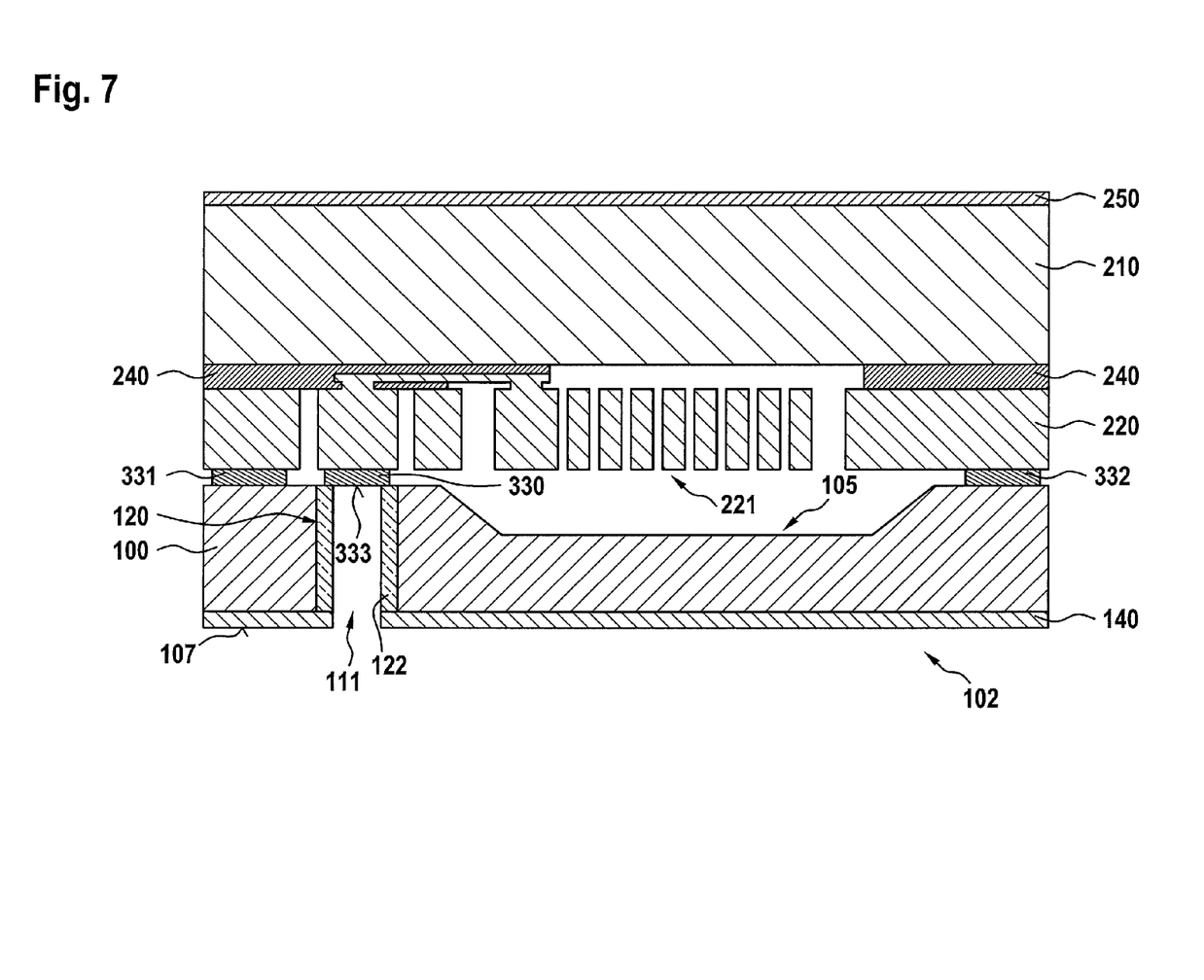
FIG. 7 shows the finished component after removal of the semiconductor material of the semiconductor substrate remaining in the contact area.

Insulating material 104 is subsequently selectively removed with respect to insulating layer 140 and selectively removed with respect to insulating material 121, preferably with the aid of an isotropic etching process, until bottom side 333 of contact structure 330 is exposed. Isotropic etching processes which also allow high aspect ratios, for example using Cl, $F_3$, or $XeF_2$, or plasma etching with $SF_6$, are preferably used for etching semiconductor punch 104. The corresponding method stage is illustrated in FIG. 7.

Figure 8:
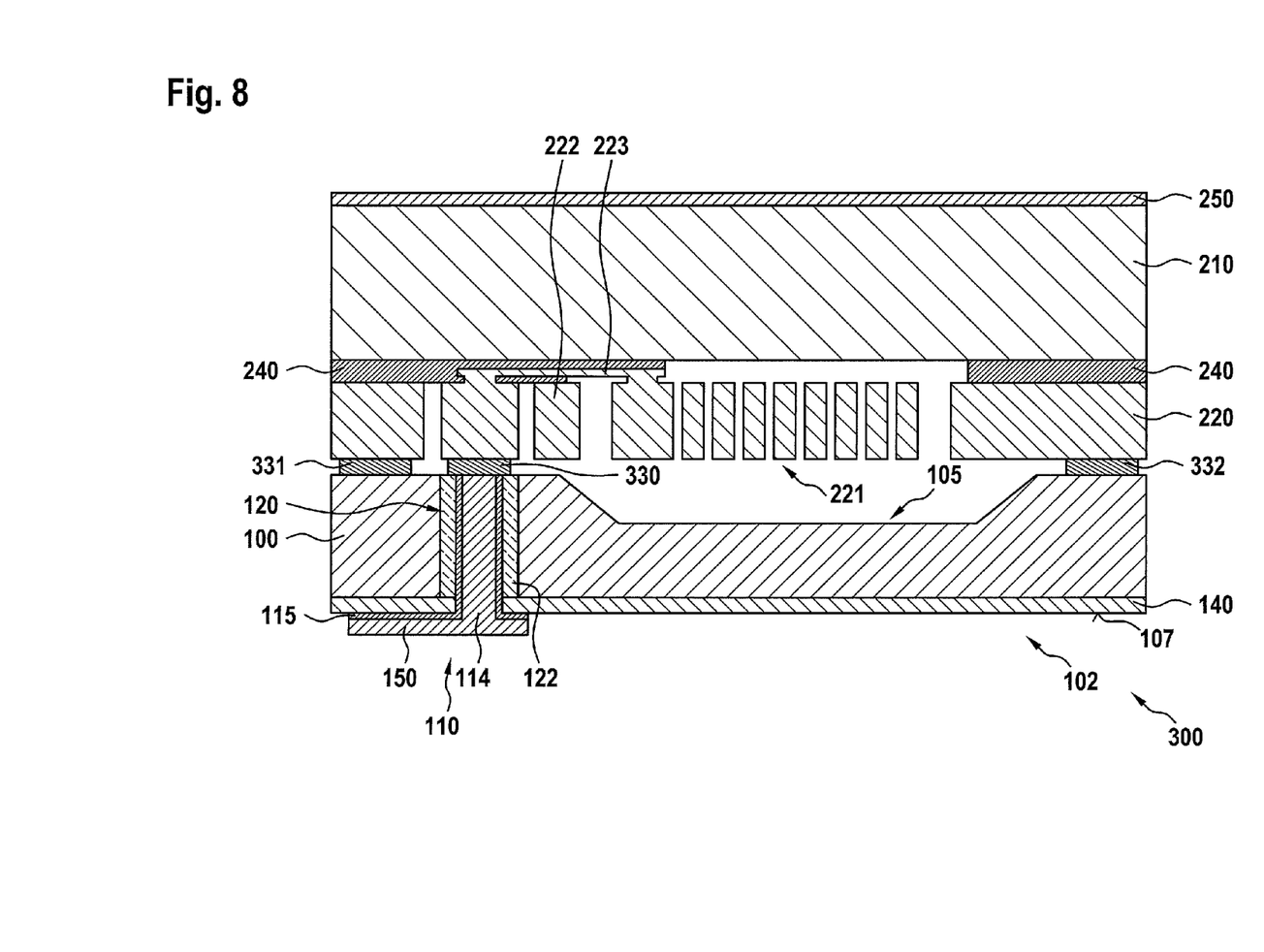
FIG. 8 shows the component from FIG. 7 after the contact hole has been filled with a metallic material.
Figure 9:
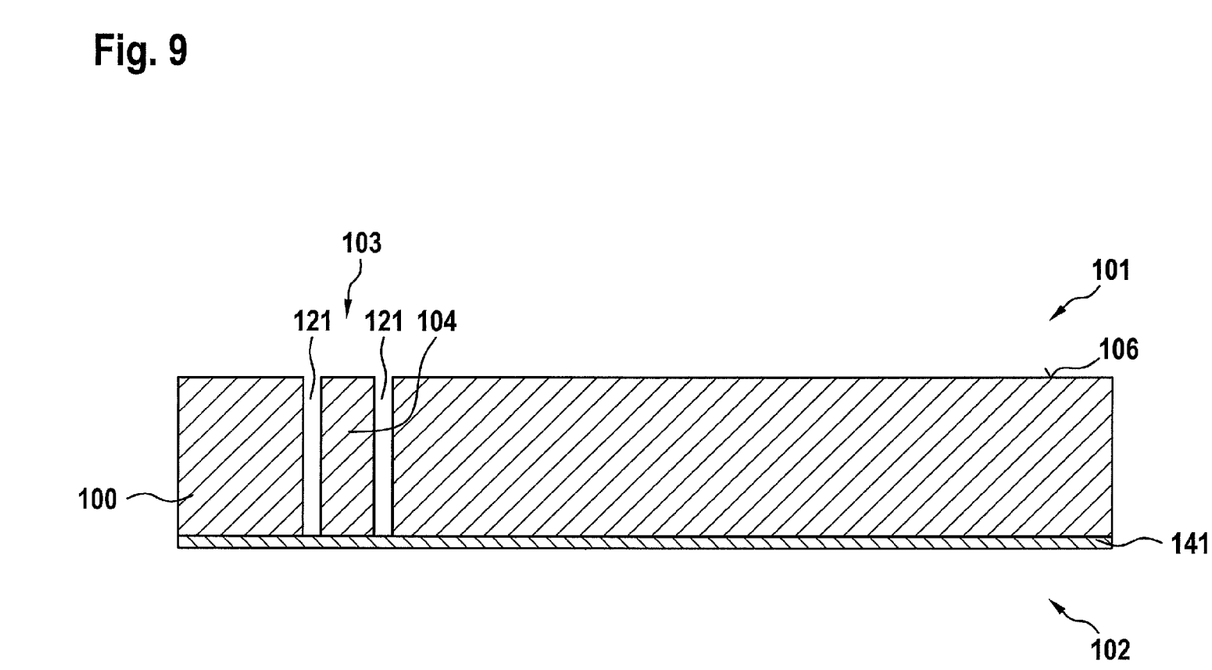
FIG. 9 shows a semiconductor substrate which has an insulating layer on back side.

Lastly, resulting contact hole 111 is filled with an electrically conductive material 114, in particular a metallic material. The filling process may also be carried out simultaneously with the establishing of rewiring 150 on back side 102 of semiconductor substrate 100. Contact hole 111 may be filled using known methods. Low-temperature processes such as electroplating application of copper (Cu ECD) are particularly advantageous. With the aid of suitable barrier layers 115 for suppressing the metal diffusion, electroplating copper deposition may be combined with seed layers for improving the layer growth. FIG. 8 shows a corresponding method stage.

For bonded wafers, it is particularly advantageous for contact hole 111 to be filled with metal only after the wafer bonding process, so that metallic filling 104 is not exposed to thermal stress during the bonding process. Thus, metals such as copper, which have a high thermal coefficient of expansion compared to silicon, may also be used for the filling process. FIG. 8 shows finished component 300, including sensor chip 200 which is bonded to semiconductor substrate 100. Semiconductor substrate 100 is used as a cap wafer for microelectromechanical functional structure 211. Microelectromechanical functional structure 211, which is designed as a motion sensor, for example, is electrically connected to electrical conductor structure 150 via electrical terminal and contact structures 223, 222, 333, and 114.

FIGS. 9 through 13 show an alternative process variant which manages without thinning of the semiconductor wafer. Thus, FIG. 9, similarly to FIG. 1, shows a semiconductor substrate 100 which in contrast to the semiconductor substrate from FIG. 1 has an insulating layer 141 on back side 102. Insulating trench 121 is now formed down to insulating layer 141. This is preferably carried out with the aid of a suitable etching process in which insulating layer 141 is used as an etch stop layer.

Figure 10:
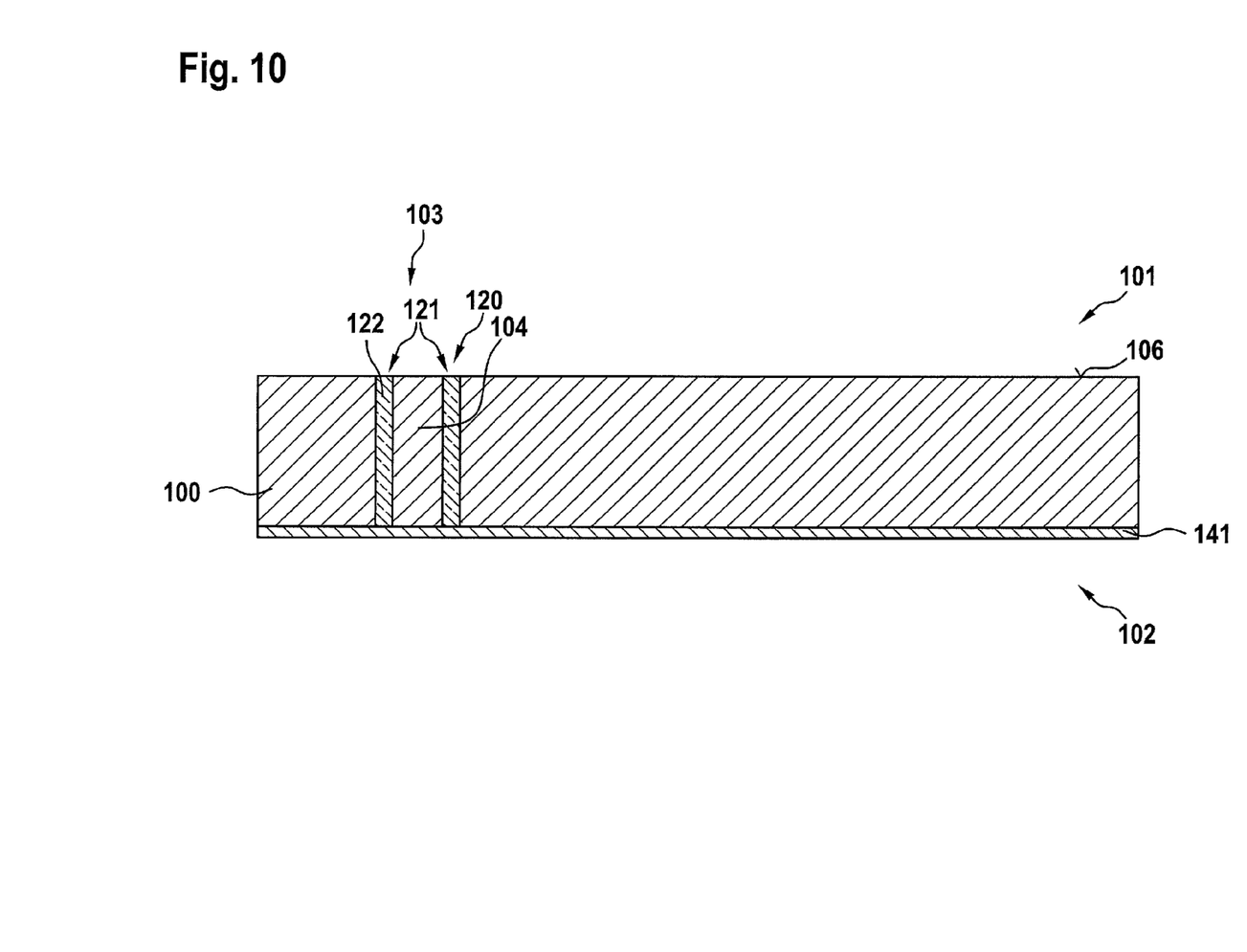
FIG. 10 shows an alternative process variant which manages without thinning of the semiconductor wafer.

Insulating trench 121 is subsequently filled with an insulating material 122, in particular glass, for example borosilicate glass. This method stage is shown in FIG. 10.

Figure 11:
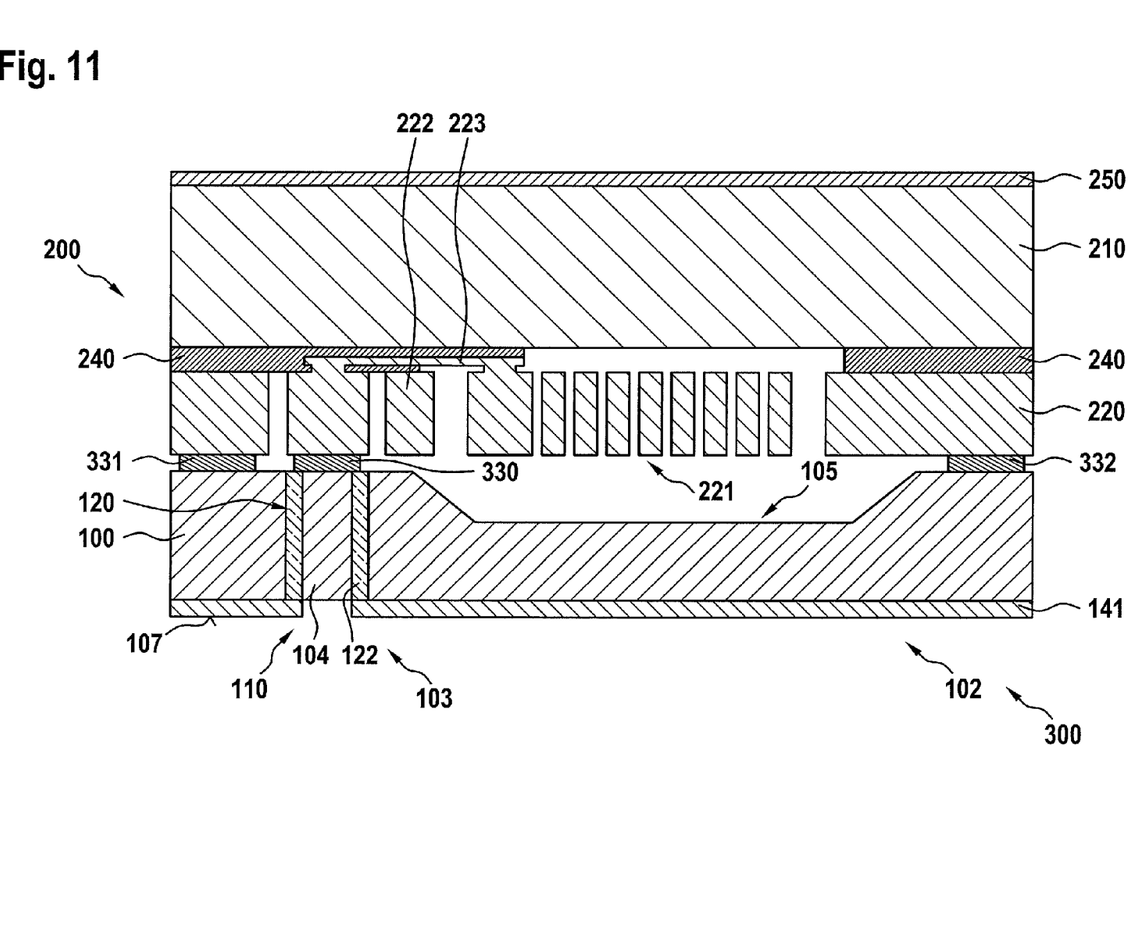
FIG. 11 shows an alternative process variant which manages without thinning of the semiconductor wafer.

A cavern 105 is then produced on front side 101 of semiconductor substrate 100. In addition, appropriate contact pads and connecting pads 130, 131, 132 are produced on front side 101 of semiconductor substrate 100, for example by depositing suitable materials. The corresponding method stage is shown in FIG. 11.

Semiconductor wafer 100 prepared in this way is bonded at its front side 101 to a functional substrate 210 or to a corresponding chip 200 in a bonding process. The corresponding method stage is shown in FIG. 11.

Insulating layer 141, which is situated on back side 102 of semiconductor substrate 100, is opened in contact area 103 in a further method step. This method stage is shown in FIG. 11.

Figure 12:
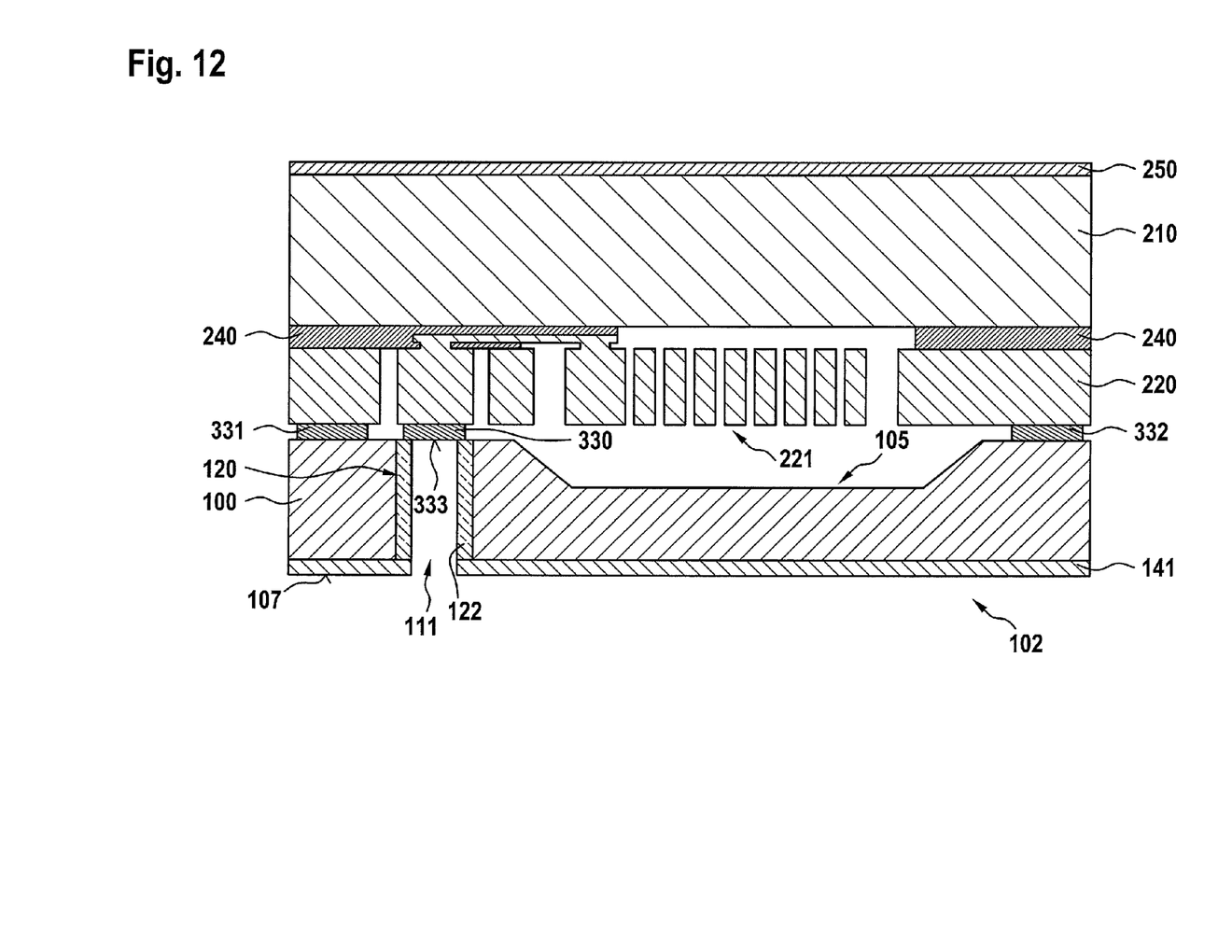
FIG. 12 shows an alternative process variant which manages without thinning of the semiconductor wafer.

Semiconductor material 104 remaining in contact area 103 is subsequently selectively removed with respect to insulating layer 141 and with respect to insulating material 122 of insulating structure 120 with the aid of a suitable method, and the bottom side of contact structure 130 is exposed. A corresponding method stage is shown in FIG. 12.

Figure 13:
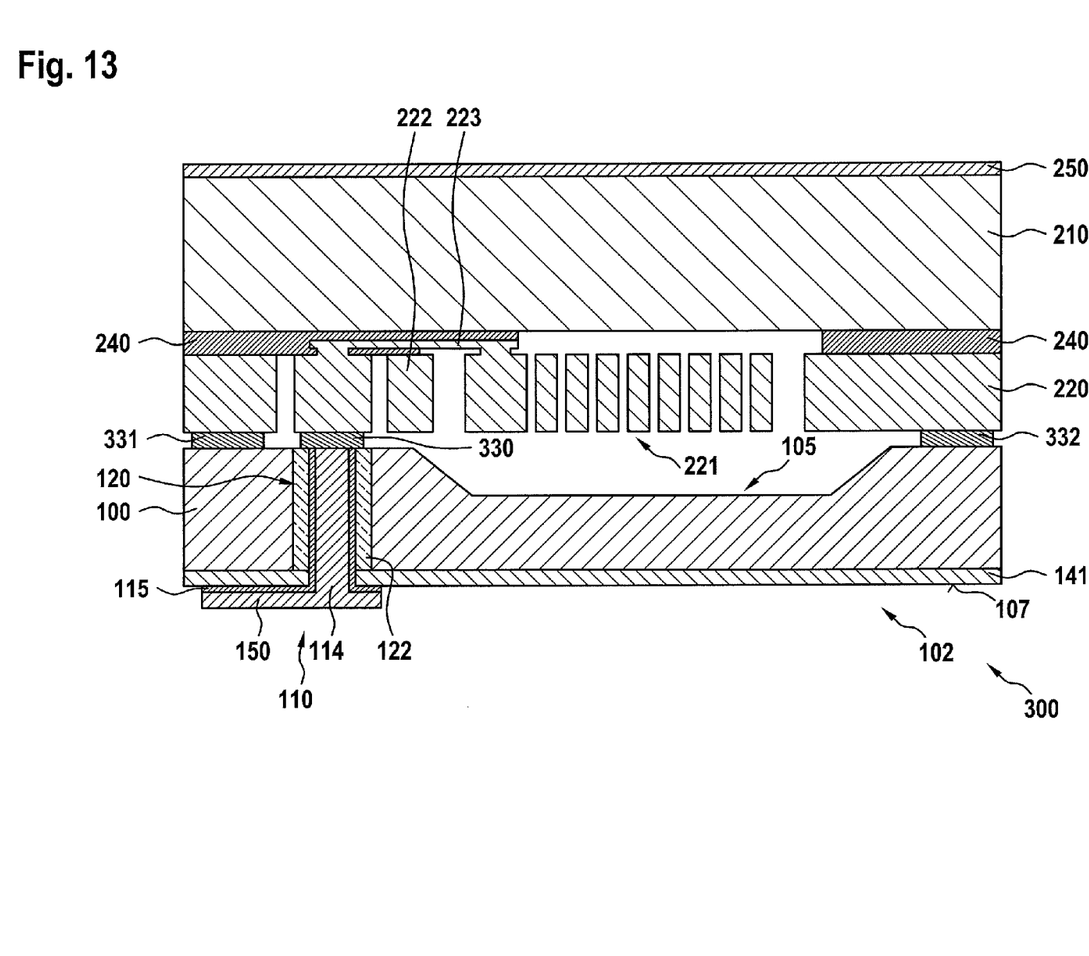
FIG. 13 shows an alternative process variant which manages without thinning of the semiconductor wafer.

Lastly, the cavity thus formed is filled with an electrically conductive material, preferably a metal. During the metal plating, rewiring structure 150 may also be produced at the same time on back side 102 of semiconductor substrate 100. The corresponding method stage is shown in FIG. 13.

As an alternative to a completely filled via, the metal plating may be implemented as a thin metal layer which only wets the side walls of the ring-shaped insulating structure.

Although the present invention has been illustrated and described in greater detail by the preferred exemplary embodiments, the present invention is not limited by the disclosed examples. Rather, other variations may also be derived therefrom by those skilled in the art without departing from the scope of protection of the present invention. In particular, any other suitable materials may be used in addition to the materials mentioned herein, for example substrate materials, metal plating materials, and insulating materials. In principle, any meaningful combination of the various materials may also be considered for this purpose.

Thus, the metal plating of the contact hole and/or establishing the rewiring may also be carried out using an inkjet printing process, for example, in which, for example, a nanosilver ink containing an easily expelled organic material as solvent is used for the metal plating. A metal paste printing process is also conceivable in principle.

Furthermore, in principle the through-connection produced here may also be used for microelectronic components in addition to microelectromechanical components.

In principle, it is possible to subsequently produce the microelectromechanical component with the aid of a so-called wafer-on-wafer process in which wafers are bonded to one another, and the bonded wafers are subsequently separated with the aid of a so-called die-on-wafer process in which individual dies are bonded to a wafer and the wafer is subsequently separated, or with the aid of a so-called die-on-die process in which already separated dies are bonded to one another.

What is claimed is:

1. A method for manufacturing a component having an electrical through-connection, comprising:
   providing a semiconductor substrate having a front side and a back side opposite from the front side;
   producing an insulating trench that annularly surrounds a contact area and is located on the front side of the semiconductor substrate;
   introducing an insulating material into the insulating trench;
   producing an electrical contact structure on the front side of the semiconductor substrate by depositing an electrically conductive material over the contact area;
   removing a semiconductor material remaining in the contact area on the back side of the semiconductor substrate to produce a contact hole that opens up a bottom side of the electrical contact structure; and
   depositing a metallic material in the contact hole to electrically connect the electrical contact structure to the back side of the semiconductor substrate.

2. The method as recited in claim 1, wherein the insulating trench is a blind hole, and the method further comprises:
   after the electrical contact structure is produced on the front side of the semiconductor substrate, thinning the semiconductor substrate from the back side; and
   exposing the insulating material.

3. The method as recited in claim 2, further comprising:
   producing an insulating layer on the back side of the semiconductor substrate after the semiconductor substrate is thinned; and selectively removing the semiconductor material remaining in the contact area with respect to the insulating layer and with respect to the insulating material in the insulating trench with the aid of an isotropic etching process.

4. The method as recited in claim 1, further comprising:
   producing an insulating layer on the back side of the semiconductor substrate, wherein, to produce the insulating trench, the semiconductor material is removed from the front side of the semiconductor substrate down to the insulating layer;
   opening the insulating layer in the contact area on the back side of the semiconductor substrate, wherein the contact hole is produced by selectively etching the semiconductor material remaining in the contact area with respect to the insulating layer and with respect to the insulating material in the insulating trench.

5. The method as recited in claim 1, further comprising:
   introducing a glass as the insulating material into the insulating trench with the aid of an embossing process.

6. The method as recited in claim 5, wherein the glass includes a borosilicate glass.

7. The method as recited in claim 1, wherein the introducing of the insulating material into the insulating trench includes a combination of an oxide deposition and a polysilicon deposition.

8. The method as recited in claim 1, wherein the depositing of the metallic material in the contact hole is carried out together with establishing a rewiring on the back side of the semiconductor substrate.

9. The method as recited in claim 1, wherein the depositing the metallic material in the contact hole includes performing a low-temperature deposition process in combination with providing at least one of a barrier layer and a seed layer.

10. The method as recited in claim 1, further comprising:
    prior to the depositing of the metallic material in the contact hole, electrically connecting the electrical contact structure to a complementary contact structure of a functional substrate within a scope of a bonding process in which the semiconductor substrate is connected to the functional substrate.

11. The method as recited in claim 10, further comprising:
    producing a cavern for accommodating a functional structure situated on the functional substrate before the semiconductor substrate is connected to the functional substrate on the front side of the semiconductor substrate.

12. A component, comprising:
    a semiconductor substrate including an electrical through-connection that passes through the semiconductor substrate from a front side to a back side opposite from the front side;
    an insulating structure provided in the through-connection and formed as an insulating trench that annularly surrounds a contact area;
    an insulating material filling the insulating trench;
    an electrical contact structure situated on the front side of the semiconductor substrate in the contact area; and
    a metallic filling, situated in the contact area, and delimited by the insulating structure, the metallic filling electrically connecting the electrical contact structure to the back side of the semiconductor substrate;
    wherein the semiconductor substrate includes a cavern and is connected to a functional substrate so that a functional structure situated on a surface of the functional substrate is present inside the cavern, and
    wherein the electrical contact structure is electrically connected to a complementary contact structure of the functional structure.

13. The component as recited in claim 12, wherein the insulating trench includes a glass as the insulating material.

14. The component as recited in claim 13, wherein the glass includes borosilicate glass.

* * * * *